(12) United States Patent
Wu et al.

(10) Patent No.: US 9,009,633 B2
(45) Date of Patent: Apr. 14, 2015

(54) METHOD OF CORRECTING ASSIST FEATURE

(71) Applicant: United Microelectronics Corp., Hsin-Chu (TW)

(72) Inventors: Tsung-Yeh Wu, Tainan (TW); Chin-Lung Lin, Hsinchu (TW); Yao-Jen Fan, Chiayi (TW); Wei-Han Chien, Kaohsiung (TW); Chia-Chun Tsai, Tainan (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/887,377

(22) Filed: May 6, 2013

(65) Prior Publication Data

US 2014/0331191 A1    Nov. 6, 2014

(51) Int. Cl.
*G06F 17/50* (2006.01)
*G03F 1/00* (2012.01)

(52) U.S. Cl.
CPC .................................. *G06F 17/5081* (2013.01)

(58) Field of Classification Search
CPC ....... G03F 1/144; G03F 1/36; G03F 7/70441; G03F 7/705; G06F 17/5068
USPC .......................................... 716/50–56; 430/5
See application file for complete search history.

(56) References Cited

U.S. PATENT DOCUMENTS

| | | | |
|---|---|---|---|
| 5,663,893 A * | 9/1997 | Wampler et al. ................ | 716/52 |
| 6,033,811 A | 3/2000 | Lee | |
| 6,077,310 A * | 6/2000 | Yamamoto et al. ............. | 716/53 |
| 6,194,252 B1 * | 2/2001 | Yamaguchi .................... | 438/129 |
| 6,303,251 B1 * | 10/2001 | Mukai et al. ...................... | 430/5 |
| 6,395,438 B1 | 5/2002 | Bruce | |
| 6,406,819 B1 * | 6/2002 | Lin ................................... | 430/5 |
| 6,470,489 B1 | 10/2002 | Chang | |
| 6,610,989 B1 * | 8/2003 | Takahashi .................. | 250/492.3 |
| 6,677,089 B2 * | 1/2004 | Ogino et al. .................... | 430/30 |
| 6,684,382 B2 | 1/2004 | Liu | |
| 6,753,115 B2 | 6/2004 | Zhang | |
| 6,763,514 B2 | 7/2004 | Zhang | |
| 6,787,459 B2 * | 9/2004 | Moniwa et al. ............... | 438/671 |
| 6,835,510 B2 * | 12/2004 | Chen et al. ......................... | 430/5 |
| 6,852,453 B2 | 2/2005 | Wu | |
| 6,961,920 B2 | 11/2005 | Zach | |
| 7,107,573 B2 * | 9/2006 | Yamazoe et al. .............. | 430/311 |
| 7,386,829 B2 | 6/2008 | Lee | |
| 7,500,219 B2 * | 3/2009 | Ogino et al. ..................... | 716/50 |
| 7,533,363 B2 * | 5/2009 | Zhang et al. .................... | 716/55 |
| 7,610,574 B2 * | 10/2009 | Shin et al. ....................... | 716/50 |
| 7,624,369 B2 | 11/2009 | Graur | |
| 7,669,169 B2 * | 2/2010 | Falbo et al. ..................... | 716/50 |
| 7,681,173 B2 * | 3/2010 | Kosa et al. ....................... | 716/53 |

(Continued)

*Primary Examiner* — Helen Rossoshek
(74) *Attorney, Agent, or Firm* — Winston Hsu; Scott Margo

(57) ABSTRACT

A method of correcting assist features includes the following steps. At first, a first layout pattern is received by a computer system, and the first layout pattern is split into a plurality of first regions. Subsequently, a plurality of assist features are added into the first layout pattern to form a second layout pattern, wherein at least one of the assist features neighboring any one of the edges of the first regions is defined as a selected pattern. Then, the second layout pattern is split into a plurality of second regions. Afterwards, a check step is performed on the second region including the selected pattern, and the second layout pattern is corrected to form a corrected second layout pattern.

17 Claims, 6 Drawing Sheets

(56) References Cited

U.S. PATENT DOCUMENTS

| | | | |
|---|---|---|---|
| 7,790,337 B2 * | 9/2010 | Misaka | 430/5 |
| 7,799,487 B2 | 9/2010 | Hamouda | |
| 7,934,173 B2 * | 4/2011 | Shyu et al. | 716/50 |
| 7,979,812 B2 * | 7/2011 | Jung et al. | 716/50 |
| 7,996,794 B2 * | 8/2011 | Kobayashi et al. | 716/51 |
| 7,998,642 B2 * | 8/2011 | Kodama et al. | 430/5 |
| 8,039,179 B2 * | 10/2011 | Shieh et al. | 430/5 |
| 8,043,948 B2 * | 10/2011 | Setta | 438/585 |
| 8,122,386 B2 * | 2/2012 | Kobayashi | 716/50 |
| 8,161,421 B2 * | 4/2012 | Viswanathan et al. | 716/53 |
| 8,312,408 B2 * | 11/2012 | Itagaki | 716/124 |
| 8,349,709 B2 * | 1/2013 | Inoue et al. | 438/460 |
| 8,669,022 B2 * | 3/2014 | Tseng | 430/5 |
| 8,683,406 B2 * | 3/2014 | Igeta et al. | 716/110 |
| 2002/0037459 A1 * | 3/2002 | Kobinata | 430/5 |
| 2002/0155357 A1 * | 10/2002 | LaCour | 430/5 |
| 2003/0106037 A1 | 6/2003 | Moniwa et al. | 716/19 |
| 2003/0229479 A1 * | 12/2003 | Smith et al. | 703/14 |
| 2004/0166422 A1 * | 8/2004 | Yamazoe et al. | 430/5 |
| 2004/0170905 A1 * | 9/2004 | Liebmann et al. | 430/5 |
| 2006/0066339 A1 | 3/2006 | Rajski | |
| 2006/0085772 A1 | 4/2006 | Zhang | |
| 2006/0161452 A1 | 7/2006 | Hess | |
| 2006/0190850 A1 * | 8/2006 | Kohle et al. | 716/2 |
| 2009/0049420 A1 * | 2/2009 | Kobayashi | 716/19 |
| 2009/0053623 A1 * | 2/2009 | Lee | 430/5 |
| 2009/0181314 A1 * | 7/2009 | Shyu et al. | 430/5 |
| 2009/0193385 A1 | 7/2009 | Yang | |
| 2009/0278569 A1 | 11/2009 | Taoka | |
| 2009/0300576 A1 | 12/2009 | Huang | |
| 2010/0021825 A1 * | 1/2010 | Kodama et al. | 430/5 |
| 2010/0036644 A1 | 2/2010 | Yang | |
| 2010/0070944 A1 | 3/2010 | Wu | |
| 2010/0086862 A1 | 4/2010 | Yang | |
| 2010/0131914 A1 | 5/2010 | Wu | |
| 2010/0175041 A1 | 7/2010 | Krasnoperova | |
| 2010/0199255 A1 * | 8/2010 | Jung et al. | 716/19 |
| 2011/0029936 A1 * | 2/2011 | Baek et al. | 716/50 |
| 2011/0029939 A1 | 2/2011 | Yang | |
| 2011/0204470 A1 * | 8/2011 | Cheng et al. | 257/499 |
| 2013/0328155 A1 * | 12/2013 | Konomi | 257/499 |
| 2014/0040836 A1 * | 2/2014 | Chou et al. | 716/52 |

* cited by examiner

METHOD OF CORRECTING ASSIST FEATURE

BACKGROUND OF THE INVENTION

1. Field of the Invention

The present invention relates to a method of correcting assist features, and more particularly, to a method of correcting assist features before performing an optical proximity correction (OPC) method which is used to modify an original layout pattern.

2. Description of the Prior Art

With the trend of miniaturization of electronic products and peripheral devices, research into thin structures and high integration of semiconductor devices has become a main concern in the industry. Lithography technology plays an important role in determining the performance of semiconductor devices.

In a semiconductor manufacturing process, the integrated circuit layout is first designed and formed as a mask pattern. The mask pattern is then proportionally transferred to a photoresist layer disposed on the semiconductor wafer through an exposure process followed by a development process. Subsequently, a corresponding etching process is performed in order to manufacture the semiconductor devices on the semiconductor wafer. With the demand of increasing integration of semiconductor devices, the design rule of line width and spaces between lines or devices becomes finer. However, due to the optical proximity effect (OPE), the width is subject to optical limitations. To obtain the fine-sized devices, the pitch i.e. the interval between transparent regions in a mask, is scaled down along with the device size. However, if the pitch is scaled down to a specific range (for example, equal to or smaller than half the wavelength of light used in the exposure process), when the light passes through the mask, diffraction and interference may occur. The resolution of the mask pattern transferred onto the photoresist layer will be affected; due to the OPE, deviations in the transferred pattern such as rounded right-angle corners, shortened line-ends, or increase/decrease of line widths may occur.

To overcome the above problems, the prior art utilizes assist features on the mask such as dummy patterns or scattering bars disposed between the layout patterns used to construct the integrated circuit (IC), for reducing the risk of deformation of the transferred pattern. Consequently, a way to form proper assist features which can be further used to assist accurate layout pattern formation on the target layer is an important issue in the field.

SUMMARY OF THE INVENTION

An objective of the present invention is therefore to provide a method of correcting assist features that increases the accuracy of the mask patterns, so that a predetermined layout pattern can be further formed.

According to one exemplary embodiment of the present invention, a method of correcting assist features includes the following steps. A first layout pattern is received by a computer system, and is split into a plurality of first regions. Subsequently, a plurality of assist features are added into the first layout pattern to form a second layout pattern, wherein at least one of the assist features neighboring any one of the edges of the first regions is defined as a selected pattern. Then, the second layout pattern is split into a plurality of second regions. Afterwards, a check step is performed on the second region including the selected pattern, and the second layout pattern is corrected to form a corrected second layout pattern.

The characteristic of the present invention is detailed below. Two split calculations are performed on the layout pattern before performing optical proximity correction (OPC) method, in order to enhance the correctness of the added assist features. More specifically, the first split method is performed on the layout pattern to form the first regions, wherein the assist feature neighboring the edge of the first regions may serve as a selected pattern. Then, the second split method—for example, the first region including the selected pattern is expanded or shifted to form the second regions in which the edges of the second regions do not overlap the selected pattern—is performed to further check the relationship between the selected pattern and the neighboring pattern (especially between the selected pattern and the assist features which are not previously included in the first region). Accordingly, an improper disposition of the assist feature can be avoided, the correctness of the mask pattern can be improved, and the predetermined layout pattern can be formed.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention, preferred exemplary embodiments will be described in detail. The preferred exemplary embodiments of the present invention are illustrated in the accompanying drawings with numbered elements.

Figure 1:
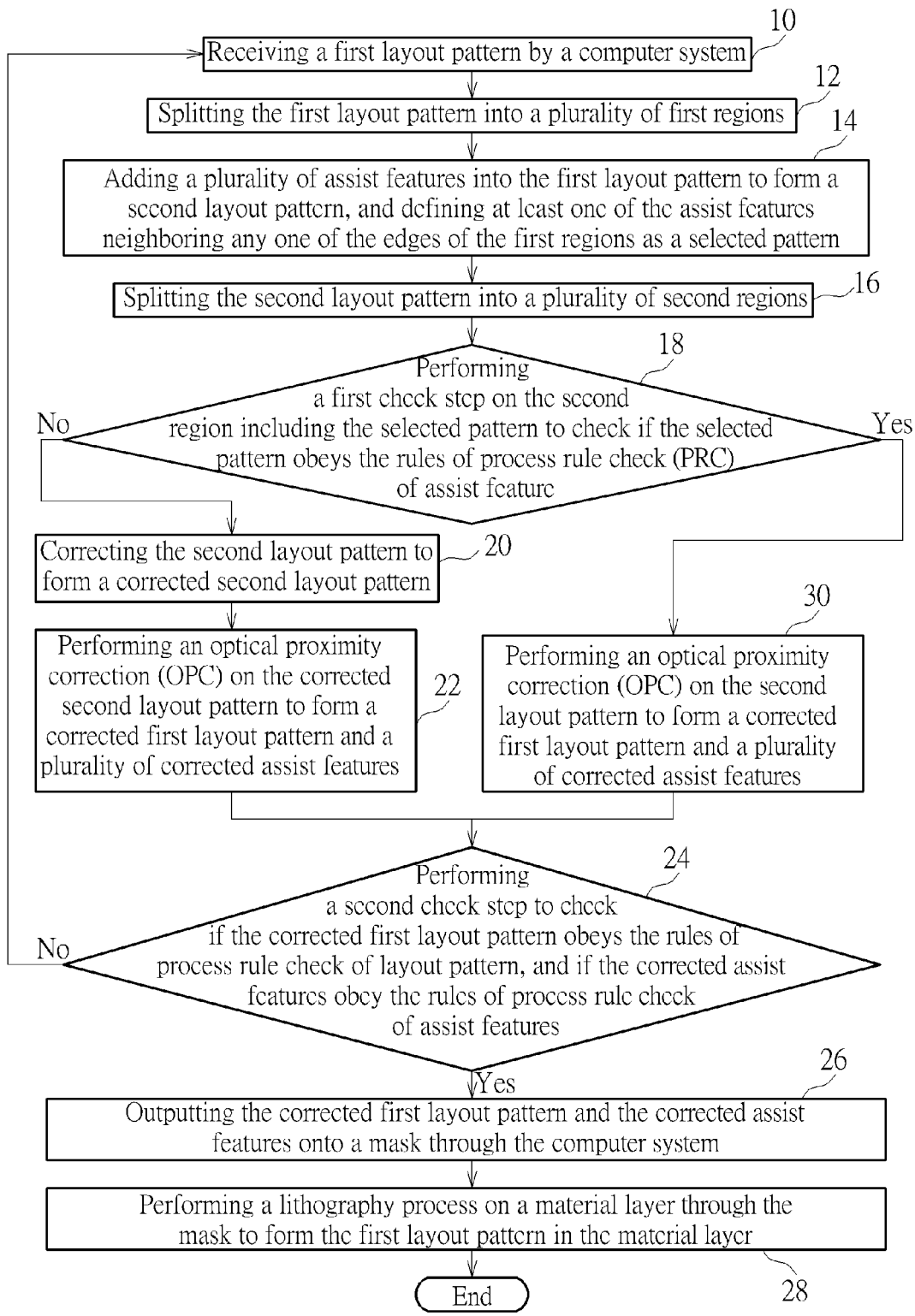
FIG. 1 is a flow chart illustrating a method of correcting assist features according to a preferred exemplary embodiment of the present invention.

Please refer to FIG. 1, which is a flow chart illustrating a method of correcting assist features according to a preferred exemplary embodiment of the present invention. As shown in FIG. 1, a first layout pattern is received by a computer system, as shown in step 10. The first layout pattern is an ideal pattern supposed to be later transferred on a mask or a material layer such as a photoresist layer on a wafer, which may include printable patterns used to construct integrated circuits (IC) such as doped region patterns, device patterns, or layout of circuits. Due to the increasing complexity of the feature patterns and the increasing integration of semiconductor devices, the first layout pattern may be split into a plurality of first regions through the computer system in advance as shown in step 12, in order to lower the loading of the computer system and reduce the time consumption of the later simulations. For example, when the first layout pattern is rectangular, the first layout pattern is divided into a plurality of rectangular first regions having the same area are obtained. Subsequently, the first regions are respectively inputted into a plurality of computer systems which can simultaneously perform the later processing steps to save time consumption of later simulations. In one exemplary embodiment, when the first layout pattern as a square-shaped pattern has an edge of 100 micrometers (μm), the first layout pattern can be split into one hundred first regions arranged as a matrix, where each of the first regions as a square-shaped pattern has an edge of 10 micrometers (μm).

Because the interval between one printable pattern and its neighboring printable pattern may be different in the first layout pattern, if the first layout pattern is directly formed in the mask, and the mask is used to perform the development process, the quantity of light passing through two sides of the printable pattern may be different for a part of the printable patterns. In other words, a deformation or shift of the patterns formed on the material layer may be found. In order to increase the correctness of the first layout pattern transferred on the material layer, a plurality of assist features are added into the first layout pattern to form a second layout pattern, as shown in step 14. The assist features are non-printable features; more specifically, when the mask including the first layout pattern and the assist features is used in a lithography process performed on a light-sensitive material layer on the wafer, only the patterns corresponding to the first layout pattern can be formed on the material layer, and the patterns corresponding to the assist features will not be formed on the material layer. In one exemplary embodiment, when the first layout pattern includes a plurality of rectangular patterns, the shapes of the added assist features may be similar to the shapes of the patterns of the first layout pattern so that the pattern density of the second layout pattern is made uniform (a uniform quantity of light passes through the mask including the second layout pattern), in order to form the predetermined layout pattern in the material layer in the later lithography process. The size, the shape, the quantity and the arrangement of the assist features can be modified according to process requirements. Additionally, the size range and the arrangement of the assist features may obey the rules of the assist feature process rule check (PRC) such as limitation of the critical dimension and the critical space. In one exemplary embodiment, a width of each of the assist features is smaller than a specific value, i.e. the maximum size of the patterns in the mask which could not be resolved through the lithography process, and larger than the exposure limit of the corresponding lithography process tool, i.e. the minimum size of the patterns which could be formed by the lithography process tool. More specifically, for a semiconductor process having critical dimensions of 20 nanometers (nm), the maximum size of the patterns in the mask which could not be resolved is substantially around 32 nm, and the exposure limit of the corresponding lithography process tool is substantially around 13 nm. Accordingly, the width of the assist feature is substantially between 13 nm and 32 nm, but not limited thereto.

To save simulation time of the computer system, the assist features are preferably simultaneously added into the first layout pattern in each of the first regions through multiple computer systems. The computer systems are used to simultaneously modify the first layout pattern in the different first regions, and the first layout pattern in each of the first regions is processed individually to add the required assist features. Subsequently, the first layout pattern and the assist features in each of the first regions are re-combined to form a second layout pattern. It should be appreciated that, because each first region only includes a part of the first layout pattern, rather than the overall original first layout pattern, the effect provided by the assist features added according to a part of the first layout pattern by the computer system may be different form the effect provided by the assist features added according to the overall first layout pattern by the computer system. Accordingly, it is preferable that the assist features of the two neighboring first regions refer to each other to further confirm the correctness of the assist features in each of the first regions. In order to shorten the time for verifying the patterns of the assist features, some interested assist features such as the assist feature neighboring the edge of the first region can be selected first in order to perform the later check step. In one exemplary embodiment, at least one of the assist features contacting any one of the edges of the first regions is defined as a selected pattern. In another exemplary embodiment, as an interval between at least one of the assist features and any one of the edges of the first regions is less than a predetermined value, the assist feature could also be defined as a selected pattern.

The second layout pattern is then split into a plurality of second regions, as shown in step 16. The method of splitting the second layout pattern into the second regions includes:
a. modifying a size of the first region to form the second region; or
b. moving each of the original first regions along any direction to form the second regions; or
c. choosing the selected pattern as a reference point, and selecting a specific range.

The edges of the newly split second regions preferably do not contact any of the assist features, and the patterns of one of the second regions (i.e. the first layout pattern and the assist features included in the second region) are different from the patterns of one of the first regions (i.e. the first layout pattern and the assist features included in the corresponding first region). It should be appreciated that modifying a size of the first region to form the second region includes expanding the first region or shrinking the first region. After the split process, a number of the second regions may be substantially different from a number of the first regions, and each of the second regions may partially overlap at least a corresponding first region. For example, the method of expanding the first region includes moving at least an edge of each of the first regions along any direction, in particular the edge that the assist feature contacts or neighbors, and this edge is moved parallel to serve as an edge of the second region. An interval between an edge of each of the second regions (newly split), and the edge of the corresponding first region (original split) is substantially larger than or equal to a specific value, so that an area of one of the second regions (expanded) is substantially larger than an area of one of the first regions (original). Alternatively, the method of expanding the first regions also includes in-situ enlarging the original first regions, i.e. moving each of the edges of each first region outward to form the second regions, while the number of the newly split second regions is the same as the number of the originally split first regions, and the newly split second regions may overlap each other. For example, each of the first regions as a square-shaped pattern has an edge of 10 micrometers (μm), and each of the second regions as a square-shaped pattern has an edge of 13 micrometers (μm). In the method of splitting the second layout pattern by choosing the selected pattern as a reference point and selecting a specific range, the specific range may be a circular range including a point of the selected pattern as a center of a circle, and a specific value as a radius. The setting of the specific value may be related to the size of the assist feature; for example, the specific value could be substantially larger than the maximum edge length of a pattern of the assist features, or correspond to the critical dimension of the assist features such as the maximum size of the patterns in the mask which could not be resolved through the lithography process.

As shown in step 18, a first check step is performed on the second layout pattern; more specifically, the second region including the selected pattern. It should be appreciated that, in a preferred exemplary embodiment, a plurality of computer systems are simultaneously used to respectively check the assist features (including the selected pattern) in each of the second regions. In other words, in the present invention, the multiple computer systems are used to simultaneously and respectively perform check process on the assist features (including the selected pattern) in each second region to confirm the assist features, and particularly to confirm if the selected pattern obeys the rules of the process rule check (PRC) of the assist feature such as the limitation of the critical dimension and the critical space for the assist feature. In another exemplary embodiment, it is also feasible that only the second regions including the selected patterns are chosen to be respectively under the individual check process; for example, when the second layout pattern is split into one hundred second regions, and only fifty second regions include the selected patterns, the computer systems are simultaneously used to respectively perform the individual check process on the assist features in these fifty second regions (including the selected patterns), or only on the selected patterns in these fifty second regions, in order to confirm if the assist features obey the rules of the process rule check of the assist features. Additionally, in another exemplary embodiment, the method of performing the first check step includes directly performing the first check step on the single selected pattern, and confirming if the selected pattern obeys the rules of the process rule check of the assist features, or combining a selected pattern and a pattern of the assist features neighboring the selected pattern to form a judicable pattern, and confirming if the judicable pattern obeys the rules of the process rule check of the assist features.

When any of the assist features such as the selected pattern or the judicable pattern does not pass the first check step, a step 20 may further be performed to correct the second layout pattern to form a corrected second layout pattern. The method of correcting the second layout pattern includes correcting the selected pattern. For example, an edge length of the selected pattern is increased, which means the edge lengths of the corrected selected patterns can be larger than the minimum edge length limit of the patterns of the assist features. Accordingly, the corrected selected patterns may achieve the functions of the normal assist feature such as uniform quantity of light passing through the later formed mask. If an edge length of the selected pattern is decreased, the edge lengths of the corrected selected patterns can be smaller than the maximum size of the patterns in the mask which could not be resolved; accordingly, the corrected selected patterns may not be formed on the material layer through the later formed mask. The corrected second layout pattern includes the first layout pattern, a part of the original assist features and the corrected selected patterns.

The above method can be used to respectively modify the assist features corresponding to the judicable pattern to form a plurality of corrected sub-assist features, and the corrected sub-assist features are further combined to form a corrected judicable pattern. For example, when an edge length of the judicable pattern is over the maximum size of the patterns in the mask which could not be resolved, an edge length of the selected pattern and an edge length of the pattern of the assist features neighboring the selected pattern in the judicable pattern can be respectively reduced to form the corrected sub-assist features. Subsequently, the corrected sub-assist features are combined to form the corrected judicable pattern, and the corrected judicable pattern will not be formed on the material layer through the later formed mask. In other exemplary embodiments, the judicable pattern can be modified by only modifying any one of the selected pattern and the assist feature neighboring the selected pattern in the judicable pattern. Accordingly, the corrected second layout pattern includes the first layout pattern, a part of the original assist features and the corrected judicable pattern.

After modifying a part of the assist features (especially the selected pattern), as shown in the step 22, at least an optical proximity correction (OPC) is performed on the corrected second layout pattern to form a corrected first layout pattern and a plurality of corrected assist features. The OPC may include the following steps. The line width, the pattern density and the relative position of each of the geometric patterns (i.e. the first layout pattern, the original assist features and the corrected selected patterns/the corrected judicable pattern) of the corrected second layout pattern are first collected and further compared with the correction standard in the data base. Subsequently, the correction value, i.e. the adjustment of each of the geometric patterns, can be calculated to correct the line width, the line end or the corner of the line segment of each of the geometric patterns. The usual way of correcting the patterns includes the adjustment of the line width of the line segment, and the disposition of assist blocks such as serif or hammerhead patterns at the line end or the corner.

As shown in step 24, a second check step is performed to check if the corrected first layout pattern obeys the rules of process rule check of layout pattern and if the corrected assist features obey the rules of process rule check of assist features, in order to further confirm the correctness of the corrected first layout pattern and the corrected assist features. For example, a process rule is inputted through a simulation mode of the computer system, and the process rule is used to inspect line ends and corners of each segment of the corrected first layout pattern in order to verify that those geometrical patterns obey the limitation of the critical dimension (critical width) and the critical space of the designed integrated circuit layout or other rules according to process requirements. When the corrected first layout pattern and the corrected assist features respectively obey its own rules of process rule check, the corrected first layout pattern and the corrected assist features can be outputted onto a mask, as shown in step 26. Conversely, if a part of, or all portions of the corrected first layout pattern and the corrected assist features violate the rules of process rule check, the corrected first layout pattern and/or the corrected assist features can be partially or overall modified through the computer system as illustrated in the flow chart. Finally, as shown in step 28, a lithography process is performed on a material layer through the mask to form the first layout pattern in the material layer, and the assist features are not formed in the material layer. The material layer could be a photoresist layer on a wafer.

When the second layout pattern passes the first check step as shown in step 18, at least an optical proximity correction (OPC) can be directly performed on the second layout pattern to form a corrected first layout pattern and a plurality of corrected assist features (similar to step 22), as shown in step 30. Afterwards, step 24 checks if the corrected first layout pattern obeys the rules of process rule check of layout pattern, and if the corrected assist features obey the rules of process rule check of assist features after completing the optical proximity correction (OPC). If the rules are obeyed, step 26 performs outputting of the corrected first layout pattern and the corrected assist features onto a mask through the computer system. If the rules are not obeyed, the corrected first layout pattern and/or the corrected assist features can be partially or totally modified through the computer system as illustrated in the flow chart. Finally, as shown in step 28, a lithography process is performed on a material layer through the mask to form the first layout pattern in the material layer, and the assist features are not formed in the material layer.

For a clearer explanation of the illustrated steps, please refer to FIG. 2 through FIG. 9, which are schematic diagrams illustrating a method of correcting assist features according to a preferred exemplary embodiment of the present invention, and please compare these figures to the steps of the flow chart illustrated in FIG. 1.

Step 10: Receiving a first layout pattern by a computer system.

Step 12: Splitting the first layout pattern into a plurality of first regions.

Figure 2:
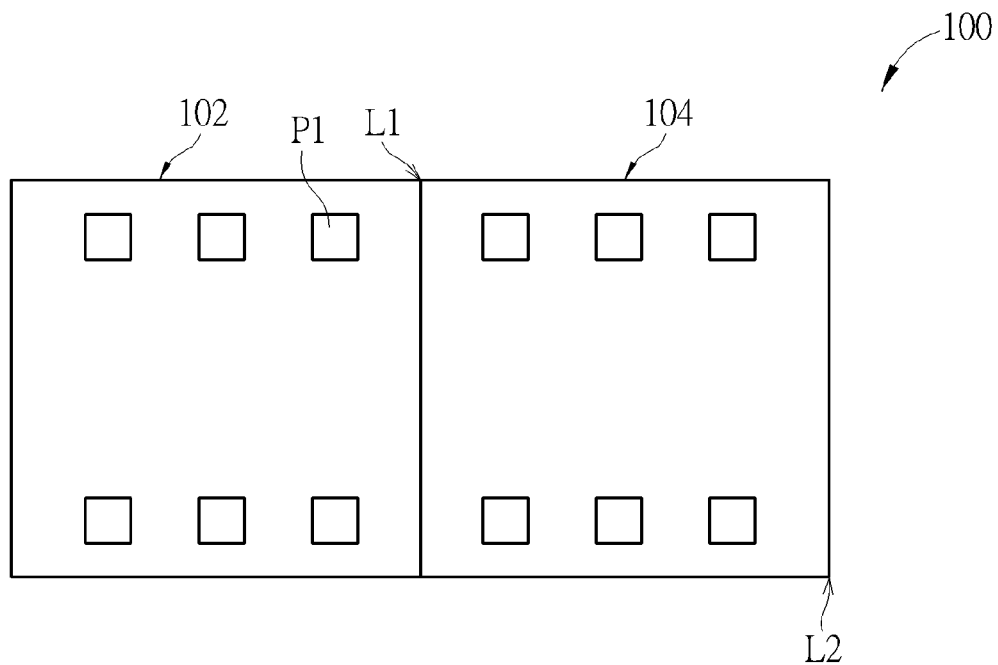
FIG. 2 through FIG. 9 are schematic diagrams illustrating a method of correcting assist features according to a preferred exemplary embodiment of the present invention.

As shown in FIG. 2, a layout pattern 100 is received by a storage medium such as a computer system (not shown), and the layout pattern 100 is split into a plurality of first regions 102/104, wherein the layout pattern 100 includes a plurality of printable patterns P1 used to construct the characteristic patterns of the integrated circuits (IC). In this exemplary embodiment, the layout pattern 100 is split into two first regions 102/104 having the same area, but is not limited thereto. The layout pattern 100 could be split into more first regions to save on time consumption used for the later simulations; moreover, the first regions may respectively include printable patterns having different shapes, different quantity or different arrangement.

Step 14: Adding a plurality of assist features into the first layout pattern to form a second layout pattern, and defining at least one of the assist features neighboring any one of the edges of the first regions as a selected pattern.

Figure 3:
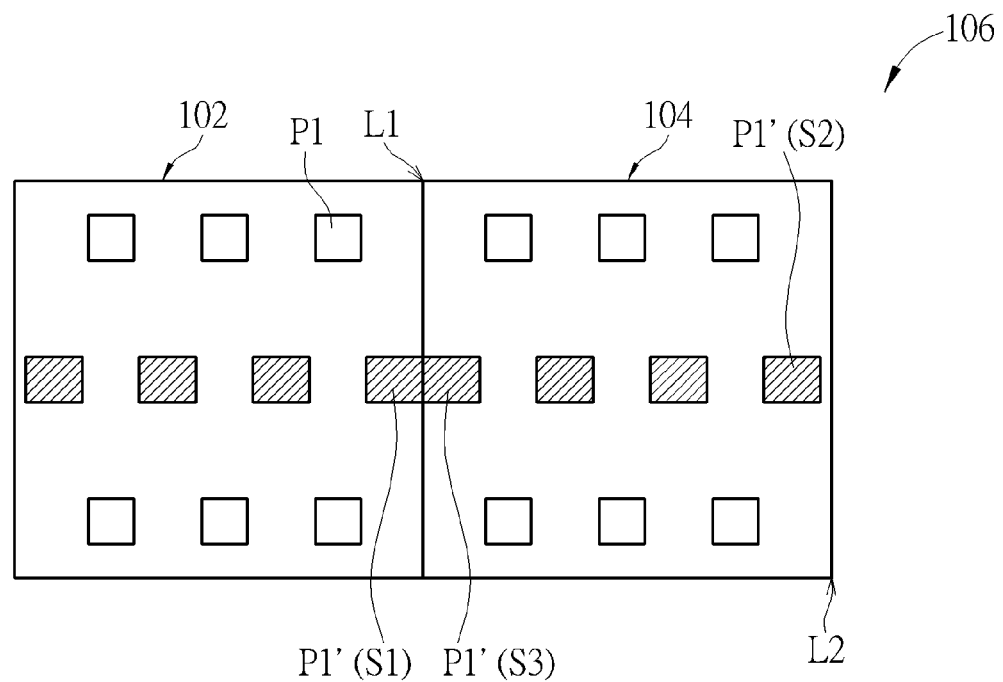

As shown in FIG. 3, in order to avoid pattern defects being formed on the material layer due to optical proximity effect (OPE), a plurality of assist features P1' are added into the first regions 102/104 respectively through the different computer systems, and the first regions 102/104 further including the assist features P1' are combined to form a second layout pattern 106, and the patterns P1 and the assist features P1' in the second layout pattern 106 are not modified through optical proximity correction (OPC) yet. The size, shape, quantity and arrangement of the assist features P1' are not limited to the illustrated embodiment and may be modified according to process requirements. In this exemplary embodiment, a size of one of the assist features P1' is substantially larger than a size of an original pattern P1 of the first layout pattern 100. Furthermore, in order to reduce the time used for manufacturing the mask, at least one of the assist features P1' neighboring any one of the edges of the first regions 102/104 will be selected for the later check steps, while the later check steps for the other assist features P1' may be omitted. The check step may be performed by comparing the assist features P1' in the two neighboring first regions 102/104 to verify the correctness of the assist features P1' in each of the first regions 102/104. In this exemplary embodiment, the assist feature P1' contacting the edge L1 of the first region 102 can be defined as a selected pattern S1. In another exemplary embodiment, when an interval between the assist feature P1' in the second layout pattern 106 and the edge L2 of the first region 104 is less than a predetermined value the assist feature P1' could be defined as a selected pattern S2. Additionally, when the second layout pattern 106 includes the assist features P1' respectively disposed in the first regions 102/104 at the two sides of the edge L1, and these assist feature P1' serve as selected patterns, one of the assist features P1' such as the selected pattern S1 in the first region 102 could be picked up as a target pattern for the later check steps, and the later check steps with the selected pattern S3 in the first region 104 as a target pattern may be omitted to avoid repeated calculation which may increase the loading of the computer system. The selected pattern S1 in the first region 102 is taken as the target pattern in the following exemplary embodiment.

Step 16: Splitting the second layout pattern into a plurality of second regions.

Figure 4:
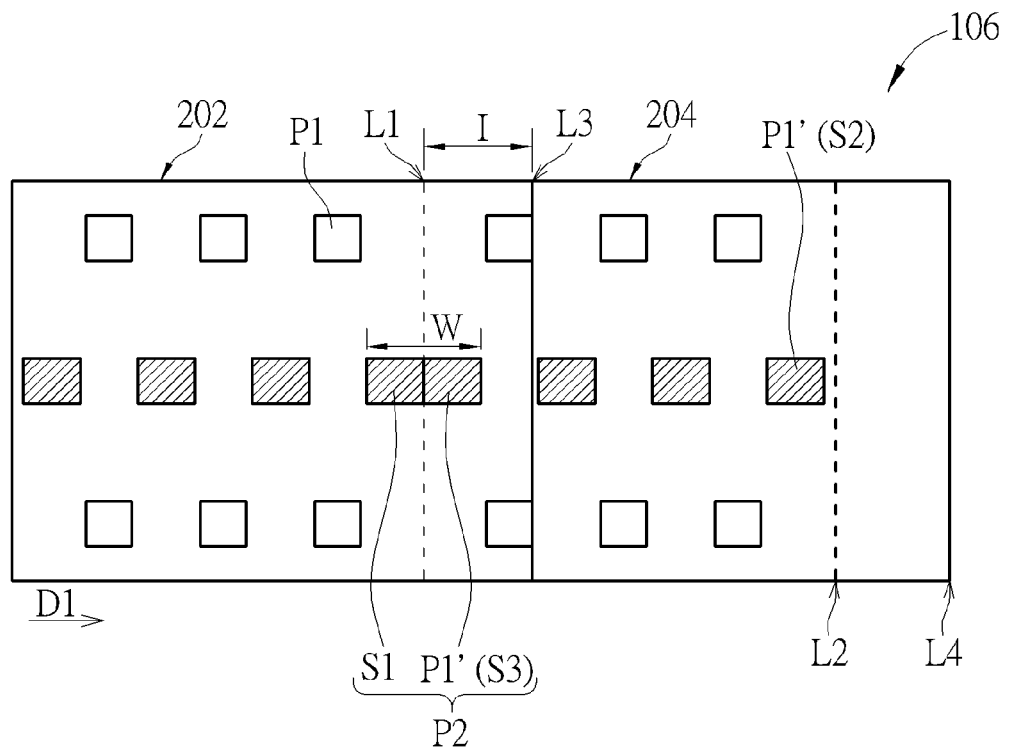

As shown in FIG. 4, the second layout pattern 106 is split into a plurality of second regions 202/204, and the edges of the second region 202 do not directly contact the selected pattern S1. Furthermore, the first layout pattern 100 (i.e. the patterns P1) and the assist features P1' in the second regions 202/204 are different from the first layout pattern 100 and the assist features P1' in the corresponding first regions 102/104. The method of splitting the second layout pattern 106 into the second regions 202/204 may include moving each of the first regions along any direction, such as enlarging a size of the first region 102 having the selected pattern S1 to form the second region 202. Any edges of the first regions 102/104 could be moved a specific distance along any direction; for example, the edge L1 of the first region 102, i.e. the edge L1 of the first region 102 which the assist feature P1' (the selected pattern S1) contacts, is moved along a horizontal direction D1 to form an edge L3 of the second region 202, and the interval I between the edge L3 of the second region 202 and the corresponding edge L1 of the first region 102 is substantially larger than or equal to a specific value. In order to verify the correctness of the assist features P1', the specific value could be substantially larger than a maximum edge length of a pattern of the assist features P1'—preferably the critical dimension of the assist features P1' such as the maximum size of the patterns in the mask which could not be resolved through the lithography process, and more preferably the sum of the critical dimension and the and the critical space of the assist features P1'. In this exemplary embodiment, the unit of splitting the second layout pattern 106 is different from the unit of splitting the first layout pattern 100 by only shifting an edge L1/L2 of each of the first region 102/104 along the horizontal direction D1, and keeping the other original edges of each of the first region 102/104. More specifically, the left edge of the second region 202 is the original left edge of the corresponding first region 102, and the right edge of the second region 202 is the moved right edge L1 of the corresponding first region 102 i.e. the edge L3. Similarly, the left edge of the second region 204 is the original left edge of the corresponding first region 104 (i.e. the right edge L1 of the corresponding first region 102), and the right edge of the second region 204 is the moved right edge L2 of the corresponding first region 104 i.e. the edge L4. The interval between the edge L3/L4 of each of the second regions 202/204 and the corresponding edge L1/L2 of the first regions 102/104 is fixed, and the total number of the second regions is the same as the total number of the first regions. Furthermore, the area of each of the second regions 202/204 is substantially larger than the corresponding area of the first region 102/104; for example, when the first region is a square-shaped pattern with an edge of 10 micrometers (μm), the second region is a rectangle-shaped pattern with one edge of 13 micrometers (μm) and another edge of 10 micrometers (μm).

The method of splitting the second layout pattern 106 into a plurality of the second regions is not limited to the above. In other exemplary embodiment, only the right edge L1 of the first region 102, i.e. the edge L1 which the selected pattern S1 contacts, is moved along the horizontal direction D1 to form the right edge L3 of one second region, but the right edge of the first regions 104 is still kept, for example, the edge L2 of the first region 104 is not moved, and the right edge of another second region may overlap the edge L2 of the first region 104. A part of the second regions (including the selected pattern) may respectively have an area larger than the area of the corresponding first region, while the other part of the second regions (without the selected pattern) may respectively have an area smaller than the area of the corresponding first region.

Figure 5:
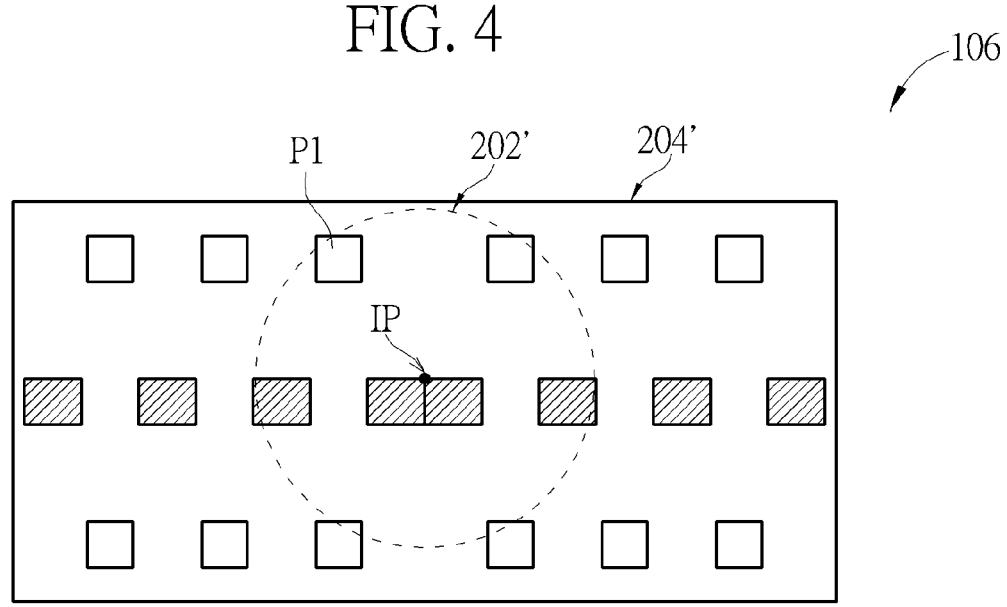

As shown in FIG. 5, the method of splitting the second layout pattern 106 into a plurality of the second regions may include directly selecting the selected patterns. More specifically, the selected pattern S1 is chosen as a reference point, and a specific range is selected as the second region 202'. The specific range may be a circular range including a point IP of the selected pattern S1 as a center of the circle, and the specific value illustrated as a radius. The other patterns of the second layout pattern 106 may be defined in another second region 204'.

Step 18: Performing a first check step on the second region including the selected pattern.

Two computer systems are simultaneously used to respectively inspect the correctness of the assist features in each of the second regions 202/204, especially if the selected patterns S1/S2/S3 obey the rules of process rule check (PRC) of assist feature. For example, the first check step is performed on the second regions 202 including the selected patterns S1/S3, where the first check step can be directly performed on the selected pattern S1 to verify if the selected pattern S1 obeys the rules of process rule check of assist feature P1' such as the limitation of the critical dimension and the critical space of assist feature P1', and the limitation of the interval between the assist feature P1' and the printable patterns P1. Alternatively, the selected pattern S1 and the assist feature P1' neighboring the selected pattern S1 such as the selected pattern S3 can be combined to form a judicable pattern P2; then, it will be verified whether the judicable pattern P2 obeys the rules of process rule check of assist feature P1'.

Step 20: Correcting the second layout pattern to form a corrected second layout pattern.

Figure 6:
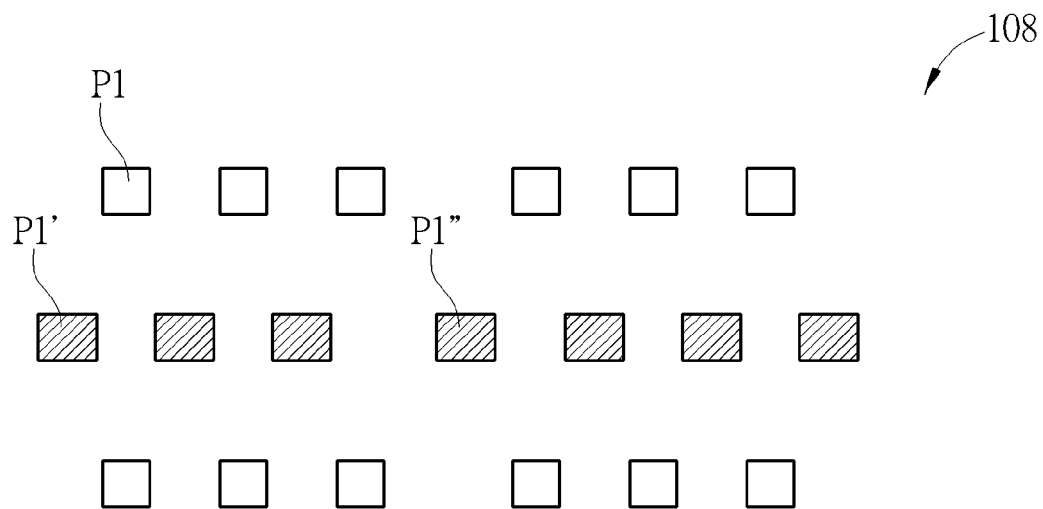

When the selected pattern S1 or the judicable pattern P2 do not pass the first check step, the second layout pattern 106 needs to be corrected; in other words, the selected pattern S1 or the judicable pattern P2 needs to be corrected. The method of modifying the selected pattern S1 is as follows. The selected pattern S1 contacts the neighboring assist feature P1' (the selected pattern S3) which disobeys the rules of process rule check of assist feature. Therefore, the size of the selected pattern S1 may be decreased: for example, a width of the selected pattern S1 is decreased or the selected pattern S1 is partially or totally removed, so that the corrected assist feature P1'' such as the combination of the corrected selected pattern S1 and the neighboring assist feature P1' (the selected pattern S3), or only the neighboring assist feature P1' (the selected pattern S3), may obey the rules of process rule check of assist feature to form a corrected second layout pattern 108, as shown in FIG. 6.

Figure 7:
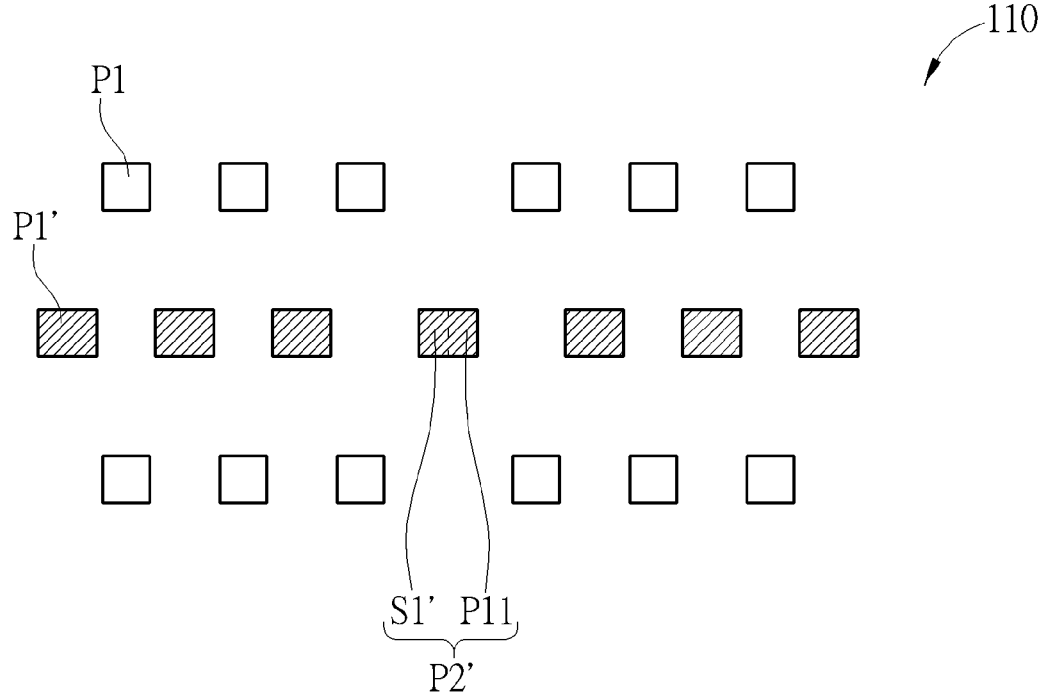

As shown in FIG. 7, the method of modifying the judicable pattern P2 is as follows. After combining the selected pattern S1 and the assist feature P1' (the selected pattern S3) which both neighbor the interface between the first region 102 and the first region 104 (i.e. the edge L1) to form the judicable pattern P2, when a width W of the judicable pattern P2 is substantially larger than the critical dimension of the assist feature P1', the width W of the judicable pattern P2 should be decreased. For example, the width of the selected pattern S1 is decreased to form a corrected sub-assist feature S1' and/or the width of the assist feature P1' constituting the judicable pattern P2 is decreased to form a corrected sub-assist feature P11. Subsequently, the corrected sub-assist features S1'/P11 are combined to form a corrected judicable pattern P2', and the width of the corrected judicable pattern P2' may be smaller than the maximum size of the patterns in the mask which could not be resolved, in order to obey the rules of process rule check of assist feature to form a corrected second layout pattern 110. A size of the corrected judicable pattern P2' and a size of each of the assist features P1' are substantially larger than a size P of any pattern of the first layout pattern 100.

Step 22: Performing an optical proximity correction (OPC) on the corrected second layout pattern to form a corrected first layout pattern and a plurality of corrected assist features.

Figure 8:
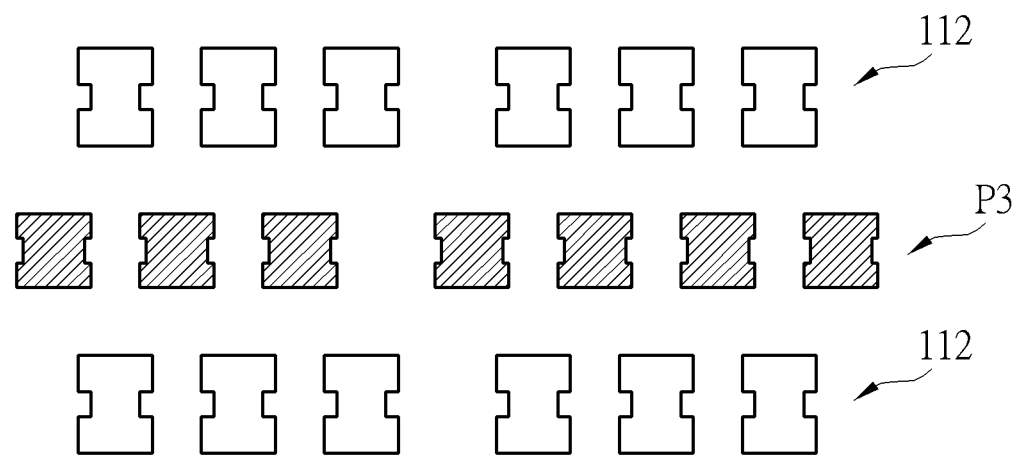
Figure 9:
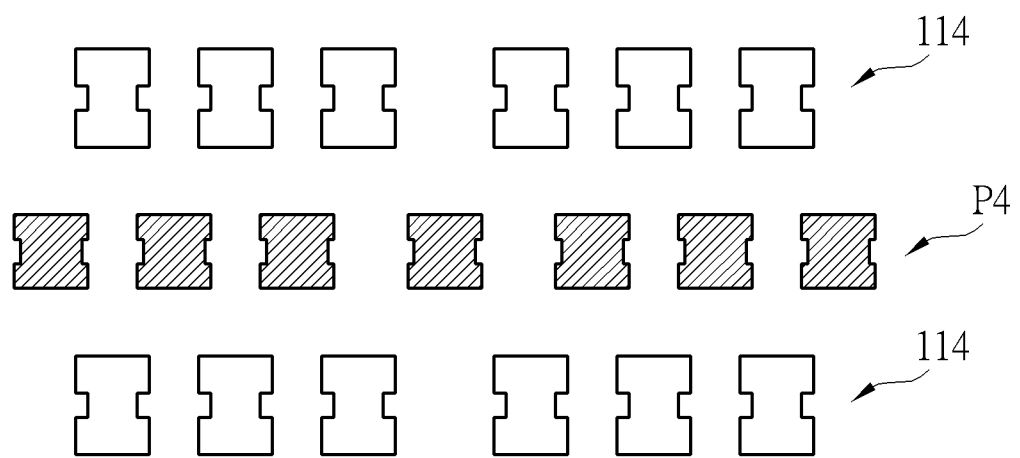

After modifying the selected pattern 51 to improve the correctness of the assist features P1', as shown in FIG. 8 and FIG. 9, at least an optical proximity correction (OPC) is performed on the corrected second layout pattern 108/110 to correct the line width, the line end or the corner of the line segment of each of the geometric patterns in the corrected second layout pattern 108/110. Therefore, a corrected first layout pattern 112/114 and a plurality of corrected assist features P3/P4 can be formed. A size of any pattern of the corrected assist features P3/P4 is substantially smaller than a size of any pattern of the corrected first layout pattern 112/114.

Step 24: Performing a second check step to check if the corrected first layout pattern obeys the rules of process rule check of layout pattern, and if the corrected assist features obey the rules of process rule check of assist features.

Step 26: Outputting the corrected first layout pattern and the corrected assist features onto a mask through the computer system.

Step 28: Performing a lithography process on a material layer through the mask to form the first layout pattern in the material layer.

Finally, the corrected first layout pattern 112/114 and the corrected assist features P3/P4 are checked again to verify if they respectively obey the rules of process rule check of layout pattern and the rules of process rule check of assist features. If this is confirmed, the following steps (such as step 26 and step 28) can be executed to form the first layout pattern 100 in the material layer, and the assist features P1' are not formed in the material layer.

Figure 10:
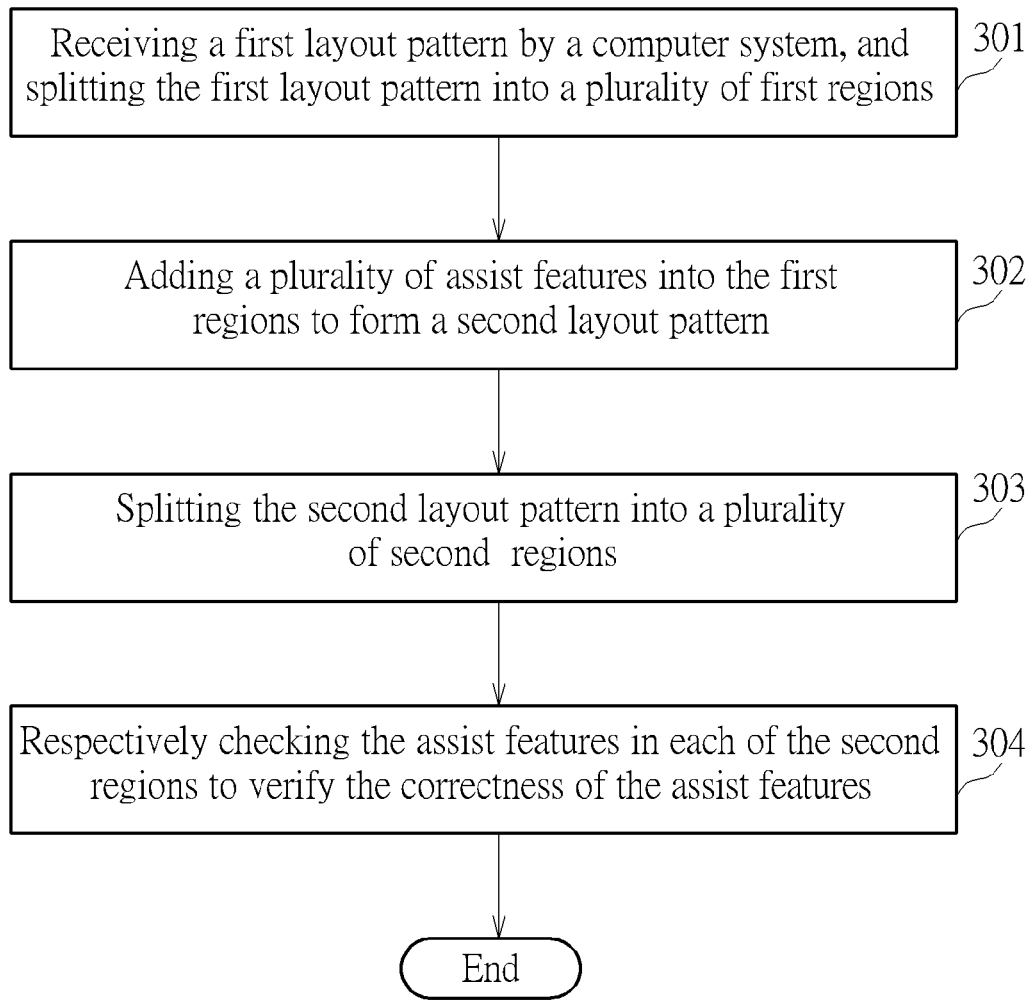
FIG. 10 is a flow chart illustrating a method of correcting assist features according to a preferred exemplary embodiment of the present invention.

Please refer to FIG. 10, which is a flow chart illustrating a method of correcting assist features according to a preferred exemplary embodiment of the present invention. As shown in step 301, a first layout pattern is first received by a computer system, and the first layout pattern is split into a plurality of first regions. Then, as shown in step 302, a plurality of computer systems are simultaneously used to respectively perform a correction process on the first layout pattern in each of the first regions to add the assist features in each of the first regions, and the first regions further including the assist features are combined to form a second layout pattern. Afterwards, as shown in step 303, the second layout pattern including the temporary assist features and the first layout pattern are re-split into a plurality of second regions. As shown in step 304, a plurality of computer systems are simultaneously used to respectively check the assist features (including the selected pattern) in each of the second regions to verify if the assist features, especially the selected pattern, obey the rules of process rule check of assist features. Some modifications may be made to the assist features to obtain a corrected second layout pattern including the final assist features before performing optical proximity correction (OPC). At least an optical proximity correction (OPC) can be additionally performed on the corrected second layout pattern (i.e. the first layout pattern and the final assist features) to further improve the correctness of the later formed mask patterns. The layout pattern split may be performed twice in the present invention, the first layout pattern split is used to add the assist features in each of the first regions, and the second layout pattern split is used to confirm if the assist features (especially the selected pattern) in each of the second regions obey the rules of process rule check of assist features.

The main spirit of the present invention is detailed below. Two split calculations are performed on a layout pattern before performing optical proximity correction (OPC), in order to enhance the correctness of added assist features. More specifically, a first split method is performed on the layout pattern to form first regions, where the assist feature neighboring the edge of the first regions may serve as a selected pattern. Then, a second split method, for example, the first region including the selected pattern is expanded or shifted to form the second regions in which the edges of the second regions do not overlap the selected pattern, is performed to further check the relationship between the selected pattern and the neighboring pattern (especially the assist features not included in the first region). Accordingly, an improper disposition of the assist feature can be avoided, the correctness of the mask pattern can be improved, and the predetermined layout pattern can be formed.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of correcting assist features, comprising:
receiving a first layout pattern by a computer system;
splitting the first layout pattern into a plurality of first regions;
adding a plurality of assist features into the first layout pattern to form a second layout pattern, and defining at least one of the assist features neighboring any one of the edges of the first regions as a selected pattern in the first regions of the first layout pattern and also in the second layout pattern;
splitting the second layout pattern into a plurality of second regions, wherein the second regions are larger than the first regions;
performing a check step on the region of the second regions that contains the selected pattern, wherein the check step comprises checking if the selected pattern obeys the rules of process rule check (PRC) of assist features;
correcting the second layout pattern to form a corrected second layout pattern; performing at least an optical proximity correction (OPC) on the corrected second layout pattern to form a corrected first layout pattern and a plurality of corrected assist features;
outputting the corrected first layout pattern and the corrected assist features onto a mask; and
performing a lithography process on a material layer through the mask to form the first layout pattern in the material layer.

2. The method of correcting assist features according to claim 1, wherein a size of any pattern of the corrected assist features is substantially smaller than the corrected first layout pattern.

3. The method of correcting assist features according to claim 1, wherein the assist features are not formed in the material layer.

4. The method of correcting assist features according to claim 1, wherein a method of splitting the second layout pattern into the second regions comprises modifying a size of at least a first region to form the second region.

5. The method of correcting assist features according to claim 4, wherein an interval between an edge of each of the second regions and the corresponding edge of the first region is substantially larger than or equal to a specific value.

6. The method of correcting assist features according to claim 5, wherein the specific value is substantially larger than a maximum edge length of a pattern of the assist features.

7. The method of correcting assist features according to claim 5, wherein the specific value is substantially a maximum size of the patterns in the mask which cannot be resolved when the mask is used in the lithography process.

8. The method of correcting assist features according to claim 1, wherein each of the second regions partially overlaps at least a corresponding first region.

9. The method of correcting assist features according to claim 1, wherein a number of the second regions is substantially different from a number of the first regions.

10. The method of correcting assist features according to claim 1, wherein a method of splitting the second layout pattern into a plurality of second region comprises moving each of the first regions along any direction.

11. The method of correcting assist features according to claim 10, wherein an area of each of the second region is substantially equal to an area of the corresponding first region.

12. The method of correcting assist features according to claim 1, wherein a method of splitting the second layout pattern into a plurality of second region comprises choosing the selected pattern as a reference point, and selecting a specific range.

13. The method of correcting assist features according to claim 12, wherein the specific range comprises a circular range including a point of the selected pattern as a center of a circle, and a specific value as a radius.

14. The method of correcting assist features according to claim 13, wherein the specific value is substantially larger than a maximum edge length of a pattern of the assist features.

15. The method of correcting assist features according to claim 1, wherein the check step comprises:
combining the selected pattern and the assist feature neighboring the selected pattern to form a judicable pattern; and
checking if the judicable pattern obeys the rules of process rule check (PRC) of assist feature.

16. The method of correcting assist features according to claim 15, wherein correcting the second layout pattern comprises:
respectively modifying the assist features corresponding to the judicable pattern to form a plurality of corrected sub-assist features; and
combining the corrected sub-assist features to form a corrected judicable pattern.

17. The method of correcting assist features according to claim 16, wherein in the corrected second layout pattern, a size of the corrected judicable pattern and a size of each of the assist features are substantially larger than a size of any pattern of the first layout pattern.

* * * * *